United States Patent
Joe et al.

(10) Patent No.: US 8,593,826 B2
(45) Date of Patent: Nov. 26, 2013

(54) MEMORY MODULE, MEMORY SYSTEM HAVING THE MEMORY MODULE, AND METHOD FOR MANUFACTURING THE MEMORY MODULE

(75) Inventors: In Sung Joe, Seoul (KR); Yoon Dong Park, Yongin-si (KR); Kyoung Won Na, Seoul (KR); Sung Dong Suh, Seoul (KR); Kyoung Ho Ha, Seoul (KR); Seong Gu Kim, Pyeongtaek-si (KR); Dong Jae Shin, Seoul (KR); Ho-Chul Ji, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 442 days.

(21) Appl. No.: 12/805,381

(22) Filed: Jul. 28, 2010

(65) Prior Publication Data

US 2011/0069464 A1 Mar. 24, 2011

Related U.S. Application Data

(60) Provisional application No. 61/272,393, filed on Sep. 18, 2009.

(30) Foreign Application Priority Data

Mar. 10, 2010 (KR) .................. 10-2010-0021117

(51) Int. Cl.
*H05K 7/00* (2006.01)
(52) U.S. Cl.
USPC .......................... 361/783; 361/760; 361/764
(58) Field of Classification Search
USPC .......................................................... 365/64
See application file for complete search history.

(56) References Cited

U.S. PATENT DOCUMENTS

| | | | | |
|---|---|---|---|---|
| 5,428,704 A | * | 6/1995 | Lebby et al. | 385/92 |
| 6,525,944 B1 | | 2/2003 | Li | |
| 2004/0042705 A1 | * | 3/2004 | Uchida et al. | 385/14 |
| 2007/0258676 A1 | * | 11/2007 | Windover | 385/14 |
| 2011/0026875 A1 | * | 2/2011 | Bowen | 385/14 |

FOREIGN PATENT DOCUMENTS

| | | |
|---|---|---|
| JP | 2004-235418 | 8/2004 |
| KR | 10-0575951 | 5/2006 |
| KR | 10-0870810 | 11/2008 |

* cited by examiner

*Primary Examiner* — Tuan T Dinh
*Assistant Examiner* — Steven Sawyer
(74) *Attorney, Agent, or Firm* — Harness, Dickey & Pierce, P.L.C.

(57) ABSTRACT

Provided is a memory module, a system using the memory module, and a method of fabricating the memory module. The memory module may include a printed circuit board and a memory package on the printed circuit board. The printed circuit board may include an embedded optical waveguide and a first optical window extending from the optical waveguide to a first surface of the printed circuit board. The memory package may also include a memory die having an optical input/output section and a second optical window. The optical input/output section, the second optical window, and the first optical window may be arranged in a line and the first optical window and the second optical window may be configured to at least one of transmit an optical signal from the optical waveguide to the optical input/output section and transmit an optical signal from the optical input/output section to the optical waveguide.

18 Claims, 13 Drawing Sheets

MEMORY MODULE, MEMORY SYSTEM HAVING THE MEMORY MODULE, AND METHOD FOR MANUFACTURING THE MEMORY MODULE

CROSS-REFERENCE TO RELATED APPLICATIONS

This application claims priority from 35 U.S.C. §119 to U.S. Provisional Patent Application No. 61/272,393 filed on Sep. 18, 2009 in the United States Patent and Trademark Office (USPTO) and to Korean Patent Application No. 10-2010-0021117 filed on Mar. 10, 2010, in the Korean Intellectual Property Office (KIPO), the entire contents of which are herein incorporated by reference.

BACKGROUND

1. Field

Example embodiments relate to a memory module, and more particularly, to a memory module having an optical window, a memory system having the memory module, and a method for manufacturing the memory module.

2. Description of the Related Art

Conventional optical packaging methods may utilize active and passive alignments each of which may include an optical fiber. In packaging a chip die by using two packaging methods, a packing cost may increase.

SUMMARY

Example embodiments provide a memory package having an optical input/output section which may perform a function of inputting/outputting data using an optical signal. Example embodiments also provide for a memory module having the memory package, a memory system having the memory module, and a method for manufacturing the memory module.

In accordance with example embodiments, a memory module may include a printed circuit board and a memory package on the printed circuit board. In example embodiments, the printed circuit board may include an embedded optical waveguide and a first optical window extending from the optical waveguide to a first surface of the printed circuit board. Furthermore, the memory package may include a memory die having an optical input/output section and a second optical window. In example embodiments, the optical input/output section, the second optical window, and the first optical window may be arranged in a line and the first optical window and the second optical window may be configured to at least one of transmit an optical signal from the optical waveguide to the optical input/output section and transmit an optical signal from the optical input/output section to the optical waveguide.

In example embodiments, a method for manufacturing a memory module is provided. In accordance with example embodiments, the method may include providing a printed circuit board having a built-in optical waveguide and a first optical window extending from the built-in optical waveguide to a surface of the printed circuit board, and placing a memory package on the printed circuit board. In example embodiments, the memory package may include a built-in memory die having an optical input/output section and a second optical window below the built-in memory die. The method may further include filling a space between the first optical window and the second optical window with a filler. In example embodiments, the memory package may be placed on the printed circuit board such that the second optical window, the optical input/output section, and the first optical window are arranged in a line.

Example embodiments are directed to a memory module. The memory module may include a PCB having a first optical window formed on a surface and a built-in optical waveguide. The memory package may be mounted on the PCB and may include a memory die having an optical input/output section and a second optical window formed on a straight line with the optical input/output section and the first optical window. The optical waveguide and the optical input/output section may send or receive an optical signal through the first optical window and the second optical window.

According to example embodiments, the PCB may further include an optical reflector for reflecting the optical signal transmitted through the optical waveguide to the optical input/output section or reflecting the optical signal output from the optical input/output section to the optical waveguide.

According to example embodiments, the PCB may further include an optical reflector for reflecting the optical signal incident through a first section of the optical waveguide to the optical input/output section through a second section of the optical waveguide or reflecting the optical signal incident to the second section through the optical input/output section to the first section. The optical reflector may meet an extension line of the first section at an angle of 45 degree.

According to example embodiments, the memory module may further include an index matching fluid, glue or an epoxy, which may fill a space between the first optical window and the second optical window and which may be optically transparent. According to example embodiments, the memory module may further include a first filler with which the first optical window is filled, a second filler with which the second optical window is filled and a third filler with which a space between the first filler and the second filler is filled.

The first filler, the second filler and the third filler may be an index matching fluid, a glue, or an epoxy.

The optical input/output section may include a photo-electric conversion element and an electric conversion element. The photo-electric conversion element may convert an optical signal, which may be output from the optical waveguide and input through the first optical window and the second optical window, to an electric signal and may transmit a converted electrical signal to a signal processing block. The electric conversion element may transmit an electrical signal output from the signal processing block to the optical waveguide through the first optical window and the second optical window.

A memory system according to example embodiments may include a main board including a signal converter, a CPU and a slot and a memory module input to the slot.

The memory module may include a PCB including a first optical window formed on a surface and a built-in optical waveguide, and a memory package, which may be mounted to the PCB and may include a memory die having an optical input/output section and a second optical window formed in a straight line of the optical input/output section and the first optical window. The optical waveguide and the optical input/output section may transmit or receive an optical signal through the first optical window and the second optical window, and the signal converter may convert an electrical signal output from the CPU to the optical signal and may transmit a converted optical signal to the waveguide or may convert the optical signal output from the waveguide to an electrical signal and may transmit a converted electrical signal to the CPU. The memory system may further include a light source generating a light necessary for transmitting or receiving data between the package and the CPU.

The PCB may further include an optical reflector for reflecting the optical signal transmitted through the optical waveguide to the optical input/output section or reflecting the optical signal output from the optical input/output section to the optical waveguide.

The memory module may further include an index matching fluid, a glue, or an epoxy, which may fill a space between the first optical window and the second optical window and may be optically transparent.

Example embodiments are also directed to a method for manufacturing a memory module. The method may include mounting a memory package including a second optical window formed at a surface and a built-in memory die on a PCB including a first optical window formed at a surface and a built-in optical waveguide. The method may further include filling a space between the first optical window and the second optical window with a filler. The second optical window may be formed in a straight line with an optical input/output section formed in the memory die and the first optical window. In example embodiments, the optical waveguide and the optical input/output section may transmit or receive an optical signal through the first optical window, the filler and the second optical window.

The method for manufacturing the memory module may further include an optical reflector for reflecting the optical signal transmitted to inside the PCB through the optical waveguide to the optical input/output section or reflecting the optical signal output from the optical input/output section to the optical waveguide.

In example embodiments, the filling a filler may include filling the first optical window with a first filler, filling the second optical window with a second filler, and filling a space between the first filler and the second filler with a third filler. The first filler, the second filler and the third filler may be an index matching fluid, a glue, or epoxy.

BRIEF DESCRIPTION OF THE DRAWINGS

These and/or other aspects and advantages of example embodiments will become apparent and more readily appreciated from the following description of example embodiments, taken in conjunction with the accompanying drawings of which.

DETAILED DESCRIPTION OF EXAMPLE EMBODIMENTS

Figure 1:
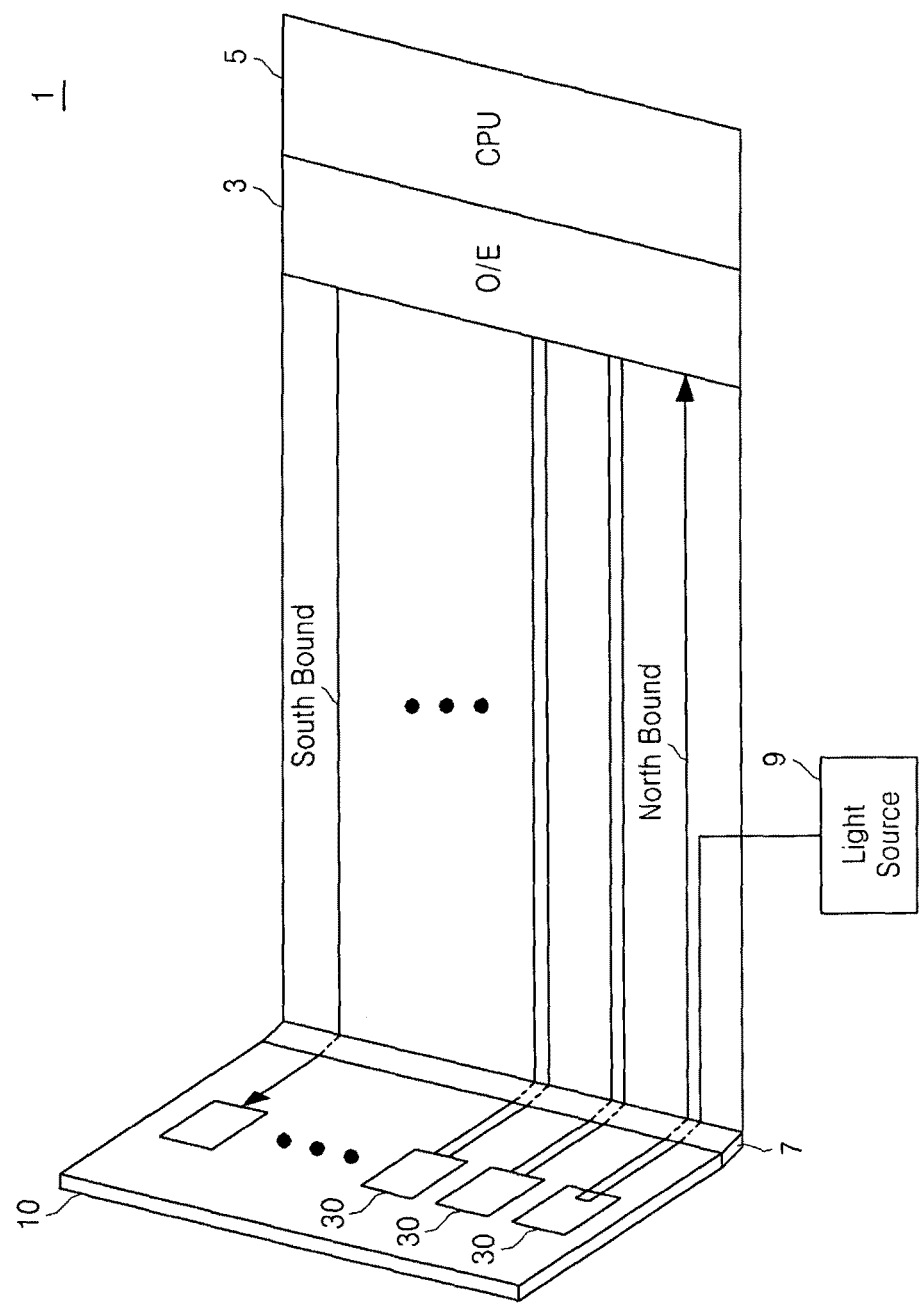
FIG. 1 shows a schematic block diagram of a memory system according to example embodiments.

Example embodiments will now be described more fully with reference to the accompanying drawings. Embodiments, however, may be embodied in many different forms and should not be construed as being limited to the embodiments set forth herein. Rather, these example embodiments are provided so that this disclosure will be thorough and complete, and will fully convey the scope to those skilled in the art. In the drawings, the thicknesses of layers and regions are exaggerated for clarity.

It will be understood that when an element is referred to as being "on," "connected to," "electrically connected to," or "coupled to" to another component, it may be directly on, connected to, electrically connected to, or coupled to the other component or intervening components that may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made in detail to example embodiments which are illustrated in the accompanying drawings, wherein like reference numerals refer to the like elements throughout.

FIG. 1 shows a schematic block diagram of a memory system according to example embodiments. The example memory system 1 includes a signal converter 3, a CPU 5, a slot 7, a light source 9, and a memory module 10.

The example memory system 1 may be a computer, a portable computer, a portable mobile communication device or consumer equipment (CE). The portable mobile communication device may include a mobile phone, a smart phone, a personal digital assistant (PDA) or a portable multi-media player (PMP). The consumer equipment (CE) may be a digital TV, a home automation device, or a digital camera.

The signal converter 3, the CPU 5, and the light source 9 may be mounted on a main board. The main board may include the slot 7. According to example embodiments, the light source 9 may be embodied in the signal converter 3, a surface of the memory module 10, or inside a memory package 30.

The signal converter 3 may perform an operation converting an optical signal to an electrical signal or converting an electrical signal to an optical signal. In example embodiments, a 'signal' may mean data and/or a control signal. For example, the signal converter 3 may convert an optical signal output from the memory package 30 to an electrical signal and transmit a converted electrical signal to the CPU 5. The signal converter 3 may also convert an electrical signal output from the CPU 5 to an optical signal and may transmit the optical signal to the memory package 30 mounted in the memory module 10 through the slot 7.

According to example embodiments, the signal converter 3 may be located on a printed circuit board (PCB) beside the CPU 5 or located inside the CPU 5, or mounted on a silicon die where the CPU 5 is mounted in the same package.

An optical input/output section (hereinafter: 'an optical I/O section', 33 of FIG. 2 to 6 or 52 of FIGS. 7 to 11) may be inside the memory package 30 and may be configured convert an optical signal to an electrical signal and transmit the electrical signal to a signal processing block (not shown) as embodied in a memory die or a chip die (31 of FIG. 2 to 6 or 51 of FIGS. 7 to 11).

The CPU 5 may control an operation of the memory system 1, e.g., a write operation or a read operation. In example embodiments, when the memory die or a chip die (31 of FIG. 2 to 6 or 51 of FIGS. 7 to 11) is a non-volatile memory device, the CPU 5 may control an operation of the memory system 1, e.g., a program operation, a write operation, a read operation, an erase operation, or a verify read operation.

The memory module 10 may be input to the slot 7. For example, the memory module 10 may be configured to plug into the slot 7. For convenience of explanation, there is only one slot illustrated in FIG. 1, however, the number of slots embodied in the memory system 1 according to example embodiments may be more than one.

The light source 9 may generate an optical signal necessary for transmitting or receiving data between the memory package 30 on the memory module 10 and the CPU 5. Accordingly, the memory package 30 and the CPU 5 may transmit or receive data to or from each other using an optical signal. For example, the light source 9 may be in the signal converter 3, the CPU 5 or the memory package 30. For convenience of explanation, there is only one light source 9 illustrated in FIG. 1, however, a plurality of light sources may be embodied in the memory system 1 according to example embodiments. For example, a light source may be embedded in each of a plurality of memory packages 30.

The plurality of memory packages 30 may be mounted on the memory module 10. A connection relation between the plurality of memory packages 30 and the memory module 10 will be explained in detail referring to FIGS. 2 to 11.

In example embodiments, a north bound North Bound may mean a path through which an optical signal output from the memory package 30 is transferred to the signal converter 3 and a south bound South Bound may mean a path through which an optical signal output from the signal converter 3 is transferred to the memory package 30.

Figure 2:
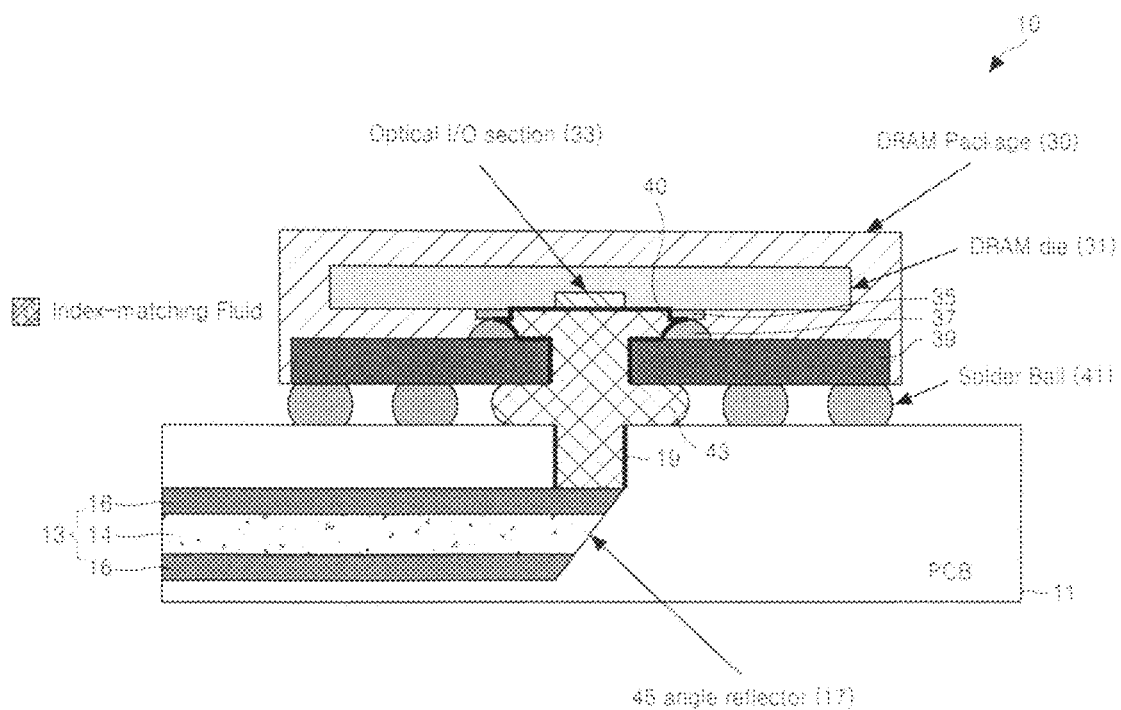
FIG. 2 shows a section of a memory module including a memory package according to example embodiments.

FIG. 2 shows a section, e.g., a cross section, of a memory module 10 including a memory package according to example embodiments. Referring to FIGS. 1 and 2, the memory module 10 may include a printed circuit board (PCB) 11 and the memory package or DRAM package 30. According to example embodiments, the memory module 10 may be embodied as an optical dual in-line memory module (DIMM), an optical fully Buffered (FB)-DIMM, an optical small outline dual in-line memory module (SO-DIMM), an optical registered DIMM (RDIMM), an optical load reduced DIMM (LRDIMM), an unbuffered DIMM (UDIMM), an optical MicroDIMM or an optical single in-line memory module(SIMM). However, example embodiments are not limited to the above described embodiments.

According to example embodiments, the PCB 11 may be a PCB for an optical DIMM, an optical FB-DIMM, an optical SO-DIMM, an optical RDIMM, an LRDIMM, an UDIMM, an optical MicroDIMM or an optical SIMM. However, example embodiments are not limited thereto and the PCB 11 may be configured to accommodate other configurations.

In example embodiments, an optical waveguide 13 may be embodied or formed inside the PCB 11. The optical waveguide 13 may include a core region 14 and a cladding region 16. According to example embodiments, a refractive index of the core region 14 may be larger than a refractive index of the cladding region 16. For example, the core region 14 and the cladding region 16 may be embodied with a polymer each having a different refractive index. According to example embodiments, the optical waveguide 13 may be embodied in several forms including a polygon shape, for example, a quadrangle, or a circle.

There may be embodied an optical reflector 17 for transmitting an optical signal incident through the optical waveguide 13 to the optical I/O section 33 embodied in the memory die 31 in the PCB 11. In example embodiments, as shown in FIG. 2, the optical reflector 17 may be inclined 45 degrees with respect to an extension line of the optical wave guide 13. This orientation may allow for light being transmitted parallel to an upper surface of the PCB 11 to be redirected to a direction perpendicular to the upper surface of the PCB 11. In the alternative, this arrangement may also allow for light being directed perpendicular to an upper surface of the PCB 11 to be redirected in a direction parallel to a surface of the PCB 11. Although example embodiments illustrate the orientation of the optical reflector 17 as being inclined 45 degrees with respect to an extension line of the wave guide 13 as shown in FIG. 2, example embodiments are not limited thereto. For example, the angle may be at any other suitable angle, for example 15 degrees or 30 degrees.

An input section of the optical I/O section 33 may include a photo-electric conversion element (e.g., a photodiode) for converting an optical signal output from the waveguide 13 to an electrical signal. Accordingly, an electrical signal output from the photo-electric conversion element may be transmitted to a signal processing block (not shown) embodied in the memory die 31.

An output section of the optical I/O section 33 may include an electrical-optical conversion element (e.g., a laser diode) for converting an electrical signal output from the signal processing block embodied in the memory die 31 to an optical signal.

According to example embodiments, an output section of the optical I/O section 33 may further include an optical modulator for modulating a signal output from the light source 9 when using the light source 9. Accordingly, an optical signal output from an output section of the optical I/O section 33 may be transmitted to the waveguide 13.

According to example embodiments, a waveguide for transmitting an optical signal output from the signal converter 3 to the memory package 30 and a waveguide for outputting an optical signal output from the memory package 30 to the signal converter 3 may be embodied separately. In example embodiments, an input section of the optical I/O section 33 and an output section of the optical I/O section 33 may be embodied in a different location.

In an upper section of the PCB 11 corresponding to a section where the optical reflector 17 is formed, a first optical window 19 or a first opening may be embodied. As shown in FIG. 2, the first optical window may extend from the optical wave guide 13 to a surface of the PCB 11. The first optical window 19 may be formed through various processes, for example, etching or drilling. According to example embodiments, to prevent the first optical window 19 from being contaminated by an external substance or dirt, or to reduce a contamination of the optical window 19 by an external substance or dirt, the first optical window 19 may be filled with a transparent substance 43, e.g., an index matching fluid, a glue, or an epoxy. The transparent substance 43 may perform a function of filler.

The first optical window 19 may perform a function of a path for transmitting an optical signal reflected from the optical reflector 17 to the optical I/O section 33 embodied in the memory die 31. The memory package 30 may include a memory die, e.g., the DRAM die 31, and a plurality of connection terminals 35 and 37. For example, the memory die 31 may be connected electrically with the PCB 39 through flip-chip bonding via the plurality of connection terminals 35 and 37.

The memory die 31 may be connected to solder balls 41 through the plurality of connection terminals 35 and 37. Accordingly, the PCB 11 and the memory package 30 may be connected electrically to each other through the solder balls 41. FIG. 2 illustrates the solder balls 41 as an example of connection terminals for connecting the PCB 11 electrically with the memory package 30, however, example embodiments are not restricted thereto. Additionally, the plurality of connection terminals 37 may be embodied as a plurality of solder balls.

A second optical window 40 or a second opening is embodied in the memory package 30. According to example embodiments, to prevent or reduce the second optical window 40 from being contaminated by an external substance or dirt, the second optical window 40 may be filled with the transparent substance 43, through which an optical signal may pass, e.g., an index matching fluid, a glue, or an epoxy.

The second optical window 40 may perform a function of an optical path for transmitting an optical signal transmitted from the waveguide 13 embodied in the PCB 11 and the first optical window 19 to the optical I/O section 33. In example embodiments, as shown in FIG. 2, the optical I/O section 33, the second optical window 40, and the first optical window 19 may be arranged in a line. Accordingly, through the first optical window 19 formed on the PCB 11 and the second optical window 40 formed in the memory package 30, an optical signal output from the optical waveguide 13 may be transmitted to the optical I/O section 33 embodied in the memory die 31.

Similarly, through the second optical window 40 formed in the memory package 30 and the first optical window formed on the PCB 11, an optical signal output from the optical I/O section 33 may be transmitted to the optical waveguide 13 or another optical waveguide which is different from the optical waveguide 13.

To prevent or reduce the first optical window 19 formed on the PCB 11 and the second optical window 40 formed in the memory package 30 from being contaminated by an external substance or dirt, the first optical window 19 formed on the PCB 11 and the second optical window 40 formed in the memory package 30 may be filled with a transparent substance such as an index matching fluid, a glue, or an epoxy. In example embodiments, the first optical window 19 and the second optical window may be filled with the transparent substance after the memory package 30 is mounted to the PCB 11, however, example embodiments are not limited thereto. The index matching fluid, the glue, or the epoxy are illustrative examples of the filler.

As illustrated in FIG. 2, the optical windows 19 and 40 and a space between the optical windows 19 and 40 may be filled with the transparent substance 43, e.g., an index matching fluid, a glue or an epoxy after the memory package 30 is mounted to the PCB 11.

Figure 3A:
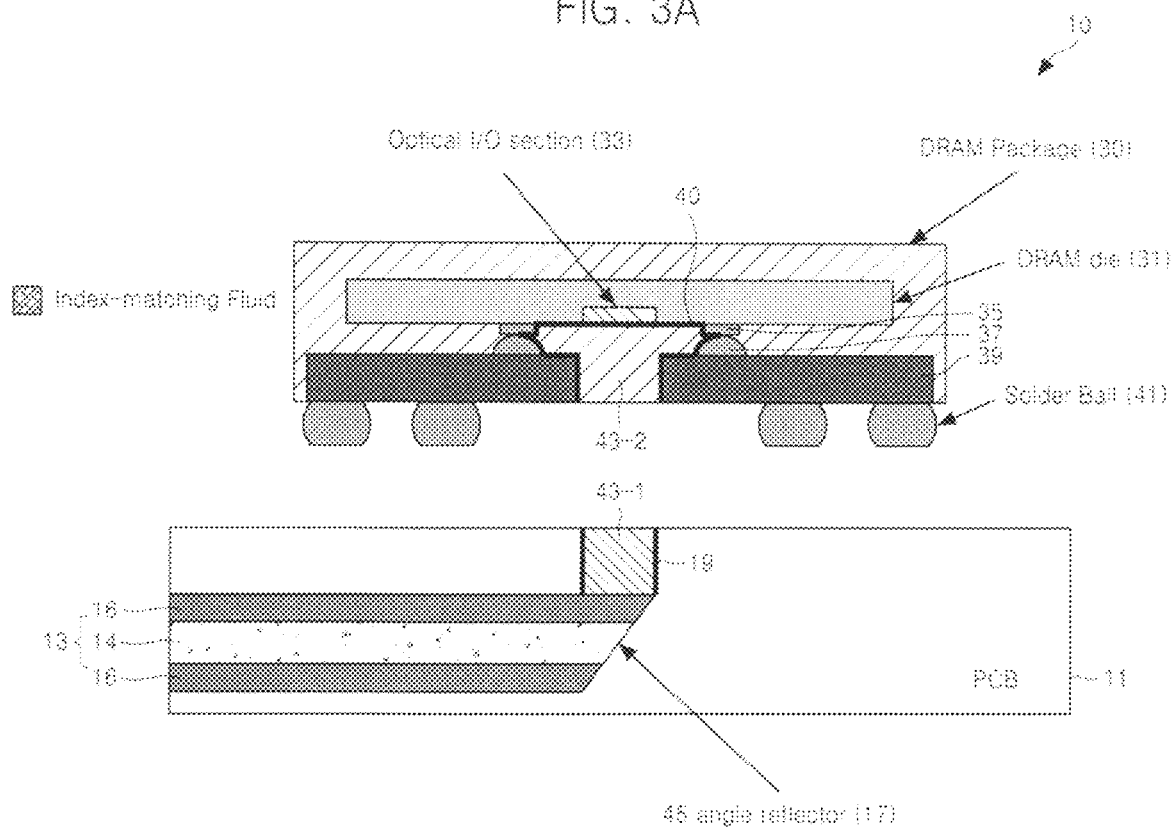
FIG. 3A shows a separate diagram of a memory module including a memory package according to example embodiments.
Figure 3B:
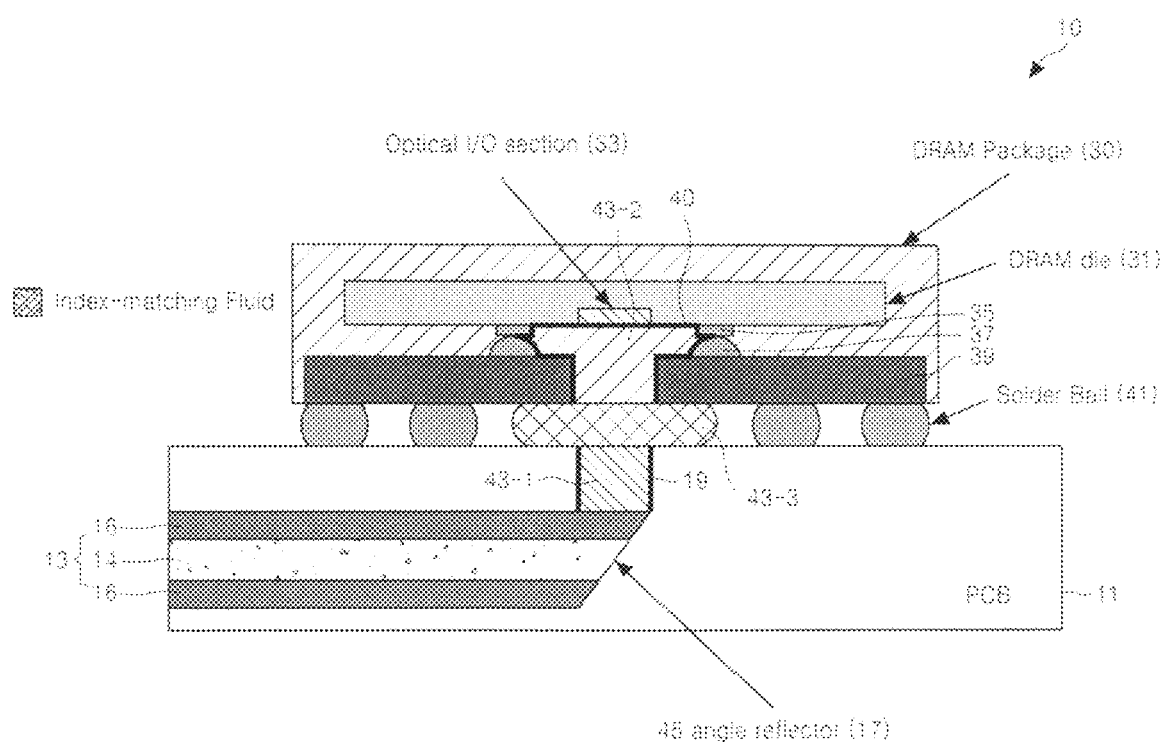
FIG. 3B shows a bonding diagram of the memory module illustrated in FIG. 3A.

FIG. 3A shows a separation diagram of a memory module 10 including a memory package 30 according to example embodiments, and FIG. 3B shows a bonding diagram of the memory module 10 illustrated in FIG. 3A. Referring to FIG. 3A, the first optical window 19 may be formed or embodied and the first optical window 19 may be filled with a first transparent substance 43-1, e.g., an index matching fluid, a glue or an epoxy, through which an optical signal may pass. Additionally, the second optical window 40 may be formed or embodied and the second optical window 40 may be filled with a second transparent substance 43-2, e.g., an index matching fluid, a glue or an epoxy, through which an optical signal may pass.

As illustrated in FIG. 3B, the memory package 30 may be mounted on the PCB 11 with a space between the first transparent substance 43-1 and the second transparent substance 43-2. The space between the first transparent substance 43-1 and the second transparent substance 43-2 may be filled with a third transparent substance 43-3, e.g., an index matching fluid, glue or an epoxy, through which an optical signal may pass. According to example embodiments, the third transparent substance 43-3 may be formed not only between the first transparent substance 43-1 and the second transparent substance 43-2 but also at whole surface of the memory package 30. For example, a memory die or a chip die 31 may be packaged in the package 30 (e.g., solder balls 41 are re-flowed, e.g., IR re-flow, to the PCB 11) and the memory package 30 may be under filled with the third transparent substance 43-3 by saturating the third transparent substance 43-3 from a side and using surface tension.

As illustrated in FIGS. 2, 3A and 3B, the first optical window 19 may be formed in the PCB 11, the second optical window 40 may be formed in the memory package 30 and a space between the optical windows 19 and 40 may be filled simultaneously or individually with an index matching fluid, a glue or an epoxy. A semiconductor substance which may be optically transparent may be used as the index matching fluid, the glue, or the epoxy. For example, the index matching fluid may be embodied as a silicon dioxide, a silicon nitride or their compound, Silicon Oxynitride (SiON).

The index matching fluid, the glue or the epoxy may prevent or reduce reflection of an optical signal caused by sudden fluctuation of refractive indexes of different substances. Moreover, the index matching fluid may increase mechanical bonding strength between the memory package 30 and the PCB 11.

The memory die 31 may include a memory cell array (not shown) for storing data. The memory die 31 may also include an access circuit, e.g., an input/output buffer, a row decoder and a column decoder and so on, for accessing the memory cell array. The memory cell array may include a plurality of memory cells. Each of the plurality of memory cells may be a volatile memory cell, for example, a DRAM cell or a non-volatile memory cell.

The non-volatile memory cell may include an Electrically Erasable Programmable Read-Only Memory (EEPROM), a flash memory, a Magnetic RAM (MRAM), a Spin-Transfer Torque MRAM, a Conductive bridging RAM (CBRAM), a Ferroelectric RAM (FeRAM), a Phase change RAM (PRAM), a Resistive RAM (RRAM or ReRAM), a Nanotube RRAM, a Polymer RAM (PoRAM), a Nano Floating Gate Memory NFGM, a holographic memory, a Molecular Electronics Memory Device or an Insulator Resistance Change Memory. The non-volatile memory cell may store a bit or plural bits. Therefore, the memory package 30 may be a memory package including a plurality of volatile memory cells or a memory package including a plurality of non-volatile memory cells.

Figure 4:
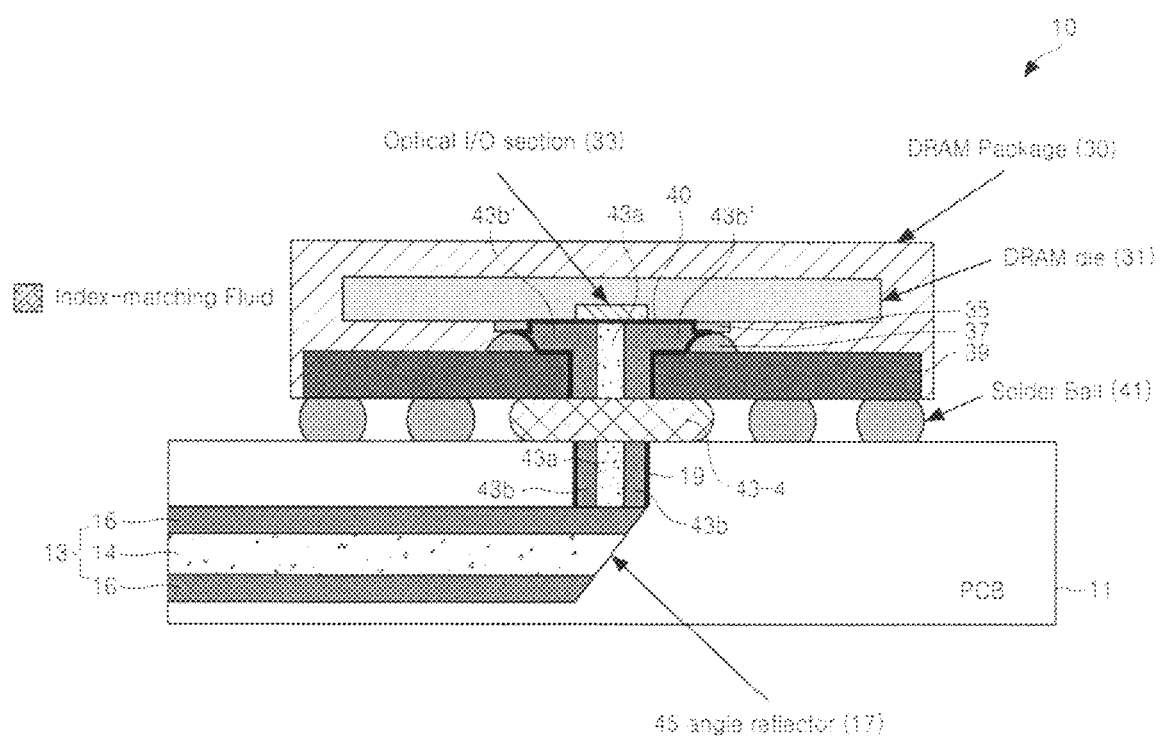
FIG. 4 shows a section of a memory module including a memory package according to example embodiments.

FIG. 4 shows a section of a memory module including a memory package according to example embodiments. Referring to FIG. 4, a first region 43a and a second region 43b surrounding the first region 43a may be formed in the first optical window 19. That is, the first region 43a and the second region 43b, which may be formed in the first optical window 19 may induce or guide an optical signal. Accordingly, the first region 43a and the second region 43b, may perform a function of a waveguide.

A refractive index of the first region 43a may be larger than one of the second region 43b. For example, the first region 43a and the second region 43b may be embodied with a polymer each having a different refractive index. According to example embodiments, a refractive index of each region 14 and 43a may be equal, similar or different from each other, and a refractive index of each region 16 and 43b may be equal, similar or different from each other.

A third region 43a' and a fourth region 43b' surrounding the third region 43a' may be formed in the second optical window 40. That is, the third region 43a' and the fourth region 43b' may be formed in the second optical window 40 to induce or guide an optical signal. Accordingly, the third region 43a' and the fourth region 43b' may perform a function of a waveguide. A refractive index of the third region 43a' may be larger than a refractive index of the fourth region 43b'. For example, the third region 43a' and the fourth region 43b' may be embodied with a polymer each having a different refractive index.

According to example embodiments, a refractive index of each region 14, 43a, and 43a' may be equal, similar or different from each other, and a refractive index of each region 16, 43b, and 43b' may be equal, similar or different from each other.

As illustrated in FIG. 4, the memory package 30 may be mounted on the PCB 11 and a space between each window 19 and 40 may be formed. The space between each window 19 and 40 may be filled with a transparent substance 43-4, e.g., an index matching fluid, a glue, or an epoxy, through which an optical signal may pass. The transparent substance 43-4 may not only prevent or reduce reflection of an optical signal but may also increase mechanical bonding strength between the PCB 11 and the memory package 30.

Figure 5:
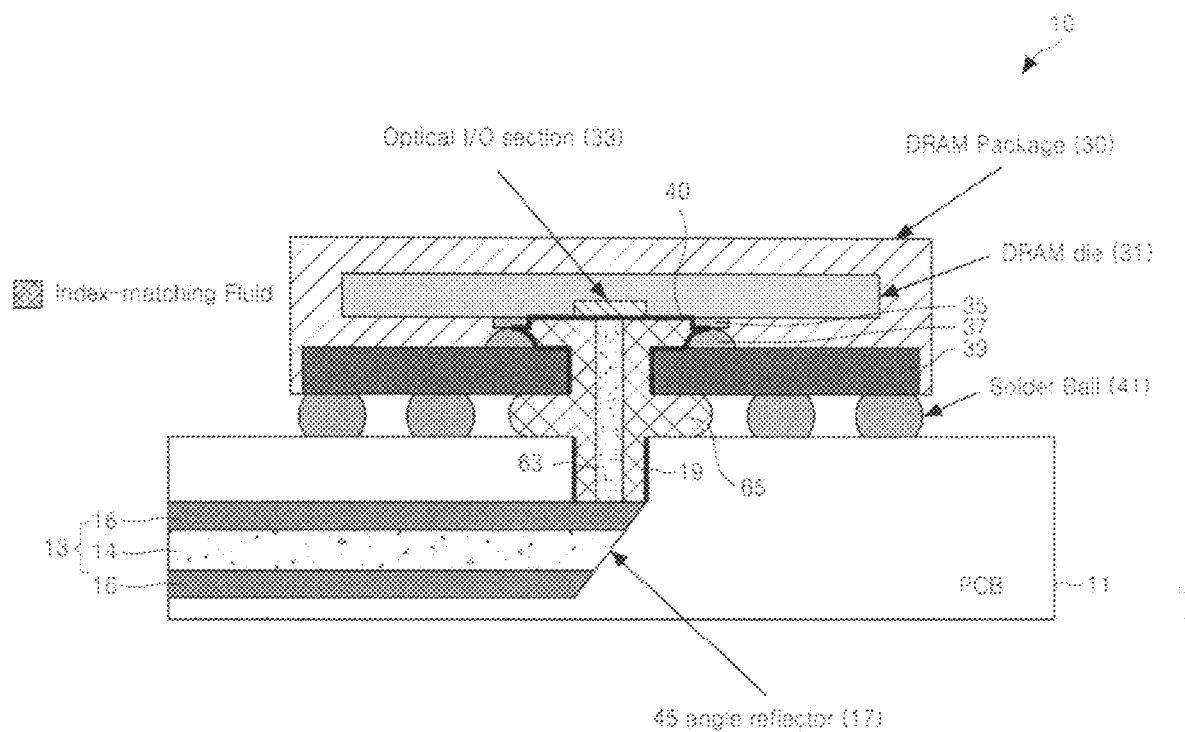
FIG. 5 shows a section of a memory module including a memory package according example embodiments.

FIG. 5 shows a section of a memory module including a memory package according to example embodiments. Referring to FIG. 5, a fifth region 63 for transmitting an optical signal may be formed in and between the first optical window 19 and the second optical window 40. A space between each optical window 19 and 40 may be filled with a transparent substance 65, e.g., an index matching fluid, a glue or an epoxy. A refractive index of the fifth region 63 may be larger than a refractive index of the transparent substance 65. The refractive index of the fifth region 63 may be equal or similar to a refractive index of the core region 14. In more detail, the fifth region 63 may be formed between the cladding region 16 and the optical I/O section 33.

Figure 6:
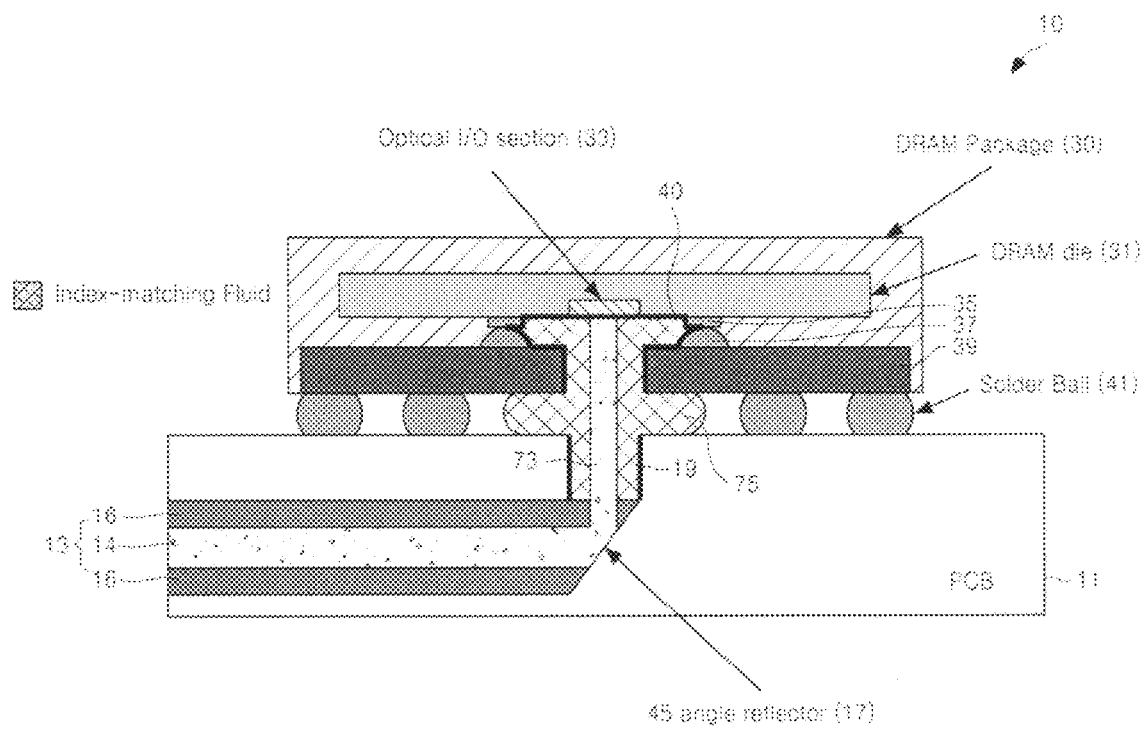
FIG. 6 shows a section of a memory module including a memory package according to example embodiments.

FIG. 6 shows a section of a memory module 10 including a memory package 30 according to example embodiments. Referring to FIG. 6, a sixth region 73 for transmitting an optical signal may be connected directly to the core region 14. Spaces between and in each optical window 19 and 40 may be filled with a transparent substance 75, e.g., an index matching fluid, a glue, and an epoxy.

Figure 7:
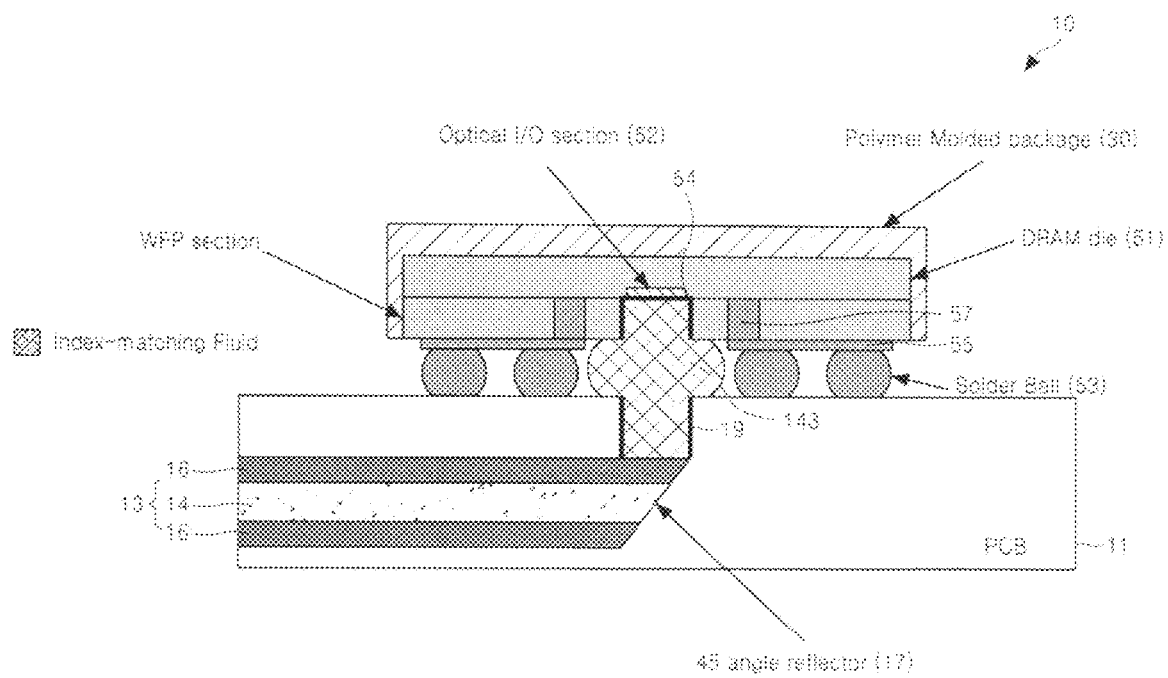
FIG. 7 shows a section of a memory module including a memory package according to example embodiments.

FIG. 7 shows a section of a memory module 10 including a memory package 30 according to example embodiments. As shown, example embodiments are applicable to a Wafer-level fabricated package (WFP). The WFP according to example embodiments may reduce or minimize a packaging cost.

A plurality of optical windows 19 and 54 performing a function of a path for transmitting an optical signal output from the waveguide 13 embodied in the PCB 11 to the optical I/O section 52 of the memory die 51 of the memory package 30 may be embodied. According to example embodiments, the optical window 19 may be formed through etching.

In example embodiments, the memory package 30 may be mounted on the PCB 11, and the first optical window 19 and the second optical window 54 may be filled with a transparent substance 143, e.g., an index matching fluid, a glue, or an epoxy, through which an optical signal may pass. The transparent substance may prevent or reduce contamination by an external substance or dirt.

The memory die 51 may be connected to solder balls 53 through a plurality of connection terminals 55 and 57. Accordingly, the PCB 11 and the memory package 30 may be connected electrically to each other through the solder balls 53.

Figure 8A:
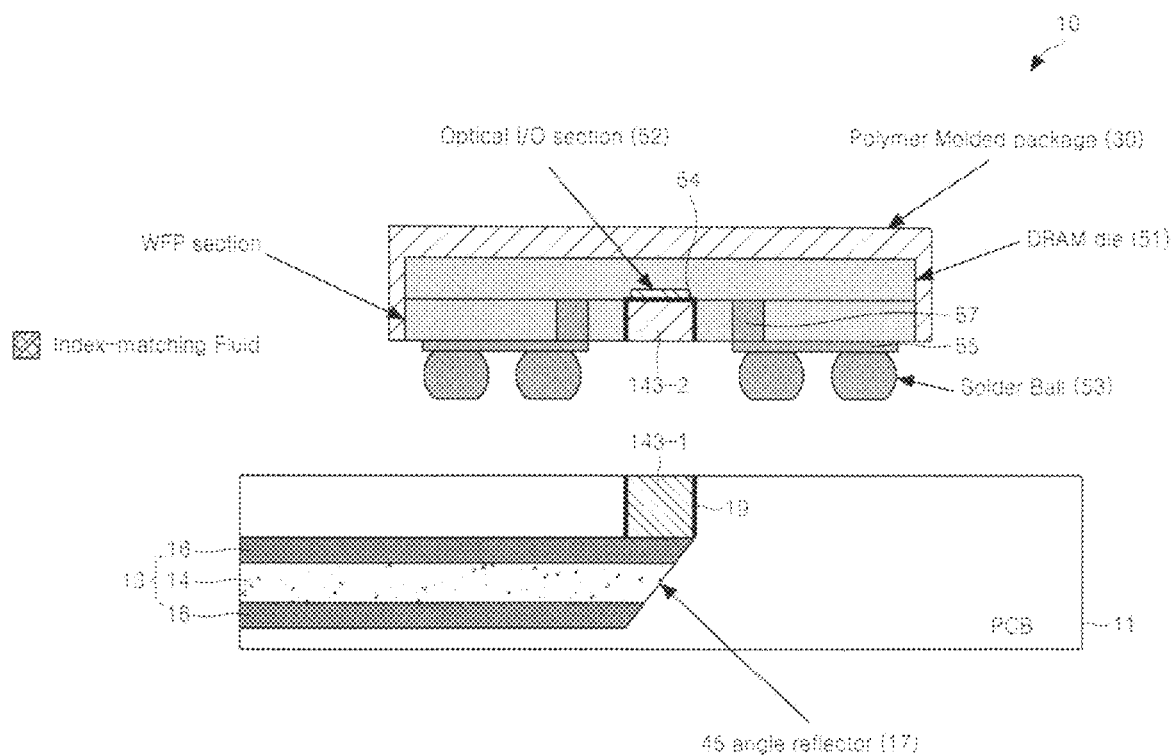
FIG. 8A shows a separate diagram of a memory module including a memory package according to example embodiments.
Figure 8B:
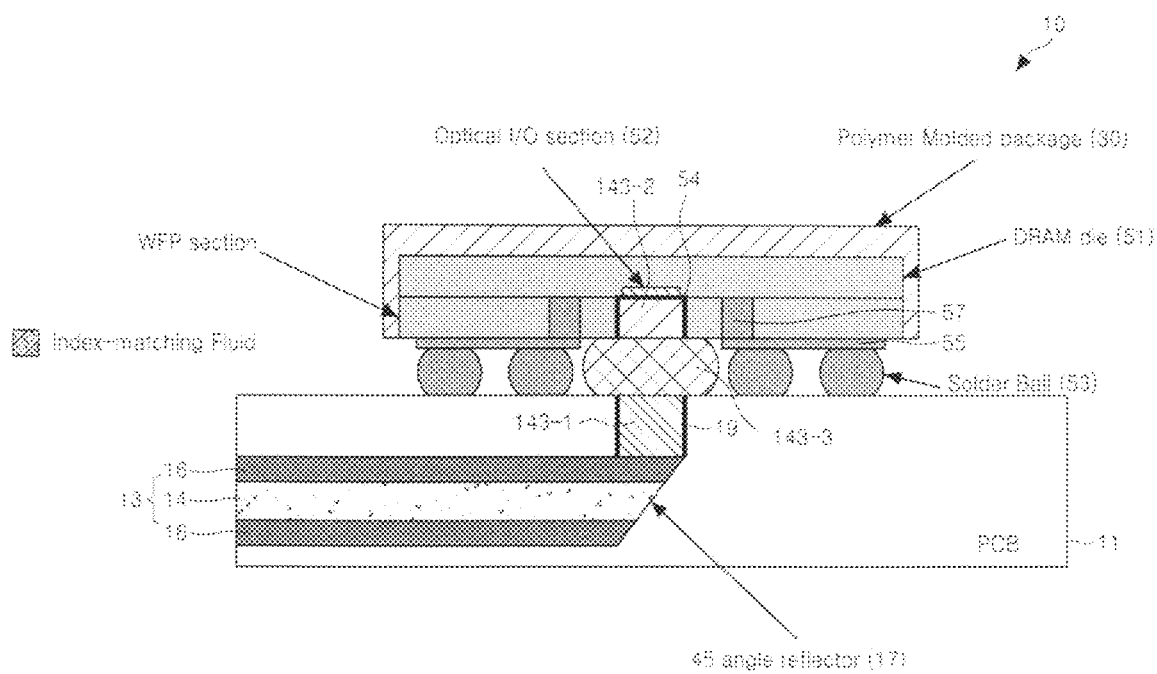
FIG. 8B shows a bonding diagram of the memory module illustrated in FIG. 8A.

FIG. 8A shows a separation diagram of a memory module 10 including a memory package 30 according to example embodiments, and FIG. 8B shows a bonding diagram of the memory module 10 illustrated in FIG. 8A. Referring to FIG. 8A, the first optical window 19 may be formed or embodied and the first optical window 19 may be filled with a transparent substance 143-1, e.g., an index matching fluid, a glue, or an epoxy, through which an optical signal may pass. In addition, the second optical window 40 may be formed or embodied and the second optical window 54 may be filled with a transparent substance 143-2, e.g., an index matching fluid, a glue, or an epoxy, through which an optical signal may pass. A semiconductor substance which is optically transparent may be used as the index matching fluid, the glue, or the epoxy. For example, the index matching fluid may be embodied as a silicon dioxide, a silicon nitride, or their compound, Silicon Oxynitrides (SiON).

As illustrated in FIG. 8B, the memory package 30 may be mounted on the PCB 11 and a space between each transparent substance 143-1 and 143-2 may be filled with a transparent substance 143-3, e.g., an index matching fluid, a glue, or an epoxy, through which a signal may pass.

As illustrated in FIGS. 7, 8A and 8B, the first optical window 19, the second optical window 54, and a space between the optical windows 19 and 54 may be filled with an index matching fluid, a glue, or an epoxy simultaneously or individually. A semiconductor substance which may be optically transparent may be used as the index matching fluid, the glue or the epoxy. For example, the index matching fluid may be embodied as a silicon dioxide, silicon nitride or their compound, silicon oxynitride (SiON).

The memory die 51 may include a memory cell array (not shown) for storing data and an access circuit (e.g., an input/output buffer, a row decoder and a column decoder, etc.) for accessing the memory cell array. The memory cell array may include a plurality of memory cells. Each of the plurality of memory cells may be a volatile memory cell, for example, DRAM cell or a non-volatile memory cell. The memory die 51 may exchange a signal with a waveguide 13 of the PCB 11 through the optical I/O section 52.

Figure 9:
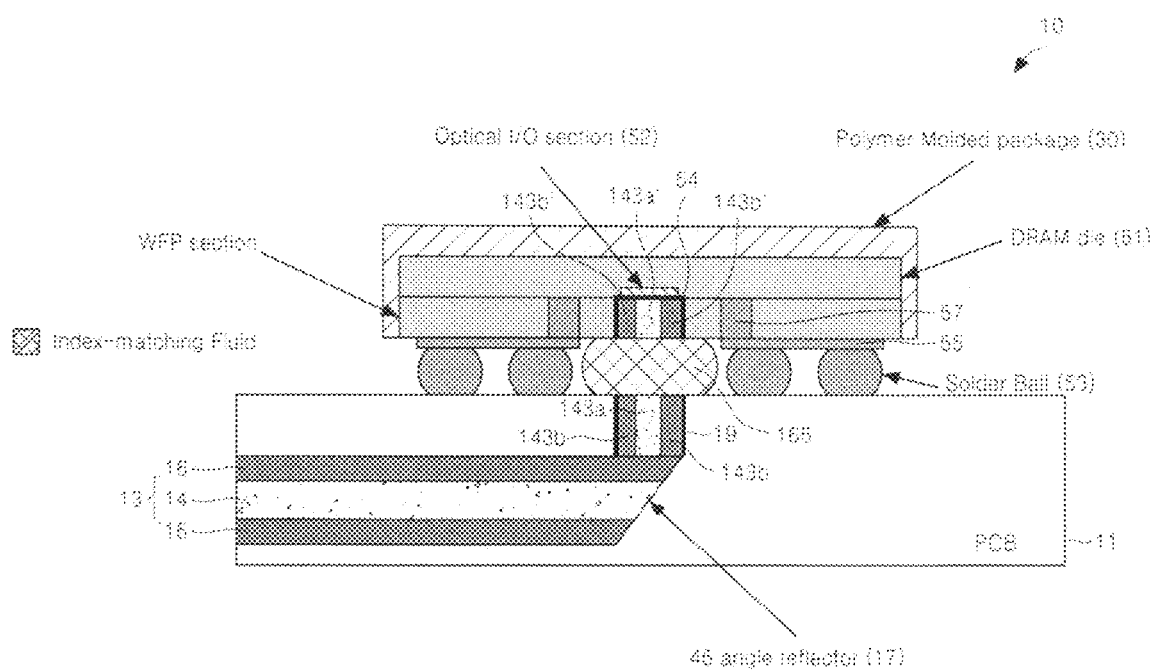
FIG. 9 shows a section of a memory module including a memory package according to example embodiments.

FIG. 9 shows a section of a memory module 10 including a memory package 30 according to example embodiments. The memory module 10 illustrated in FIG. 9 may include a Wafer-level fabricated package (WFP). Referring to FIG. 9, a seventh region 143a and an eighth region 143b surrounding the seventh region 143a may be formed in the first optical window 19. That is, the seventh region 143a and the eighth region 143b may be formed in the first optical window 19 to induce or guide an optical signal. Accordingly, the seventh region 143a and the eighth region 143b may perform a function of a waveguide.

A refractive index of the seventh region 143a may be larger than a refractive index of the eighth region 143b. For example, the seventh region 143a and the eighth region 143b may be embodied with a polymer each having a different refractive index. According to example embodiments, a refractive index of each region 14 and 143a may be equal, similar or different from each other. Likewise, a refractive index of each region 16 and 143b may be equal, similar or different from each other.

A ninth region 143a' and a tenth region 143b' surrounding the ninth region 143a' may be formed in a second optical window 54. That is, the ninth region 143a' and the tenth region 143b' may be formed in the second optical window 54 and may induce or guide an optical signal. Accordingly, the ninth region 143a' and the tenth region 143b' may perform a function of a waveguide. A refractive index of the ninth region 143a' may be larger than a refractive index of the tenth region 143b'. For example, the ninth region 143a' and the tenth region 143b' may be embodied with a polymer each having a different refractive index.

According to example embodiments, a refractive index of each region 14, 143a, and 143a' may be equal, similar or different to each other, and a refractive index of each region 16, 143b, and 143b' may be equal, similar or different to each other.

As illustrated in FIG. 9, the memory package 30 may be mounted on the PCB 11 and a space between each window 19 and 54 may be filled with a transparent substance 165, e.g., an index matching fluid, a glue, or an epoxy, through which an optical signal may pass. The transparent substance 165 may increase a mechanical bonding strength between the PCB 11 and the memory package 30 as well as prevent or reduce reflection of an optical signal. According to example embodiments, the transparent substance 165 may be formed on a whole surface of the memory package 30. For example, a memory die or a chip die 51 may be packaged in the package 30, e.g., the solder balls 53 may be re-flowed to the PCB 11 (e.g., IR re-flow) and the memory package 30 may be under-filled with the transparent substance 165 by infiltrating the transparent substance 165 from a side and using a surface tension.

Figure 10:
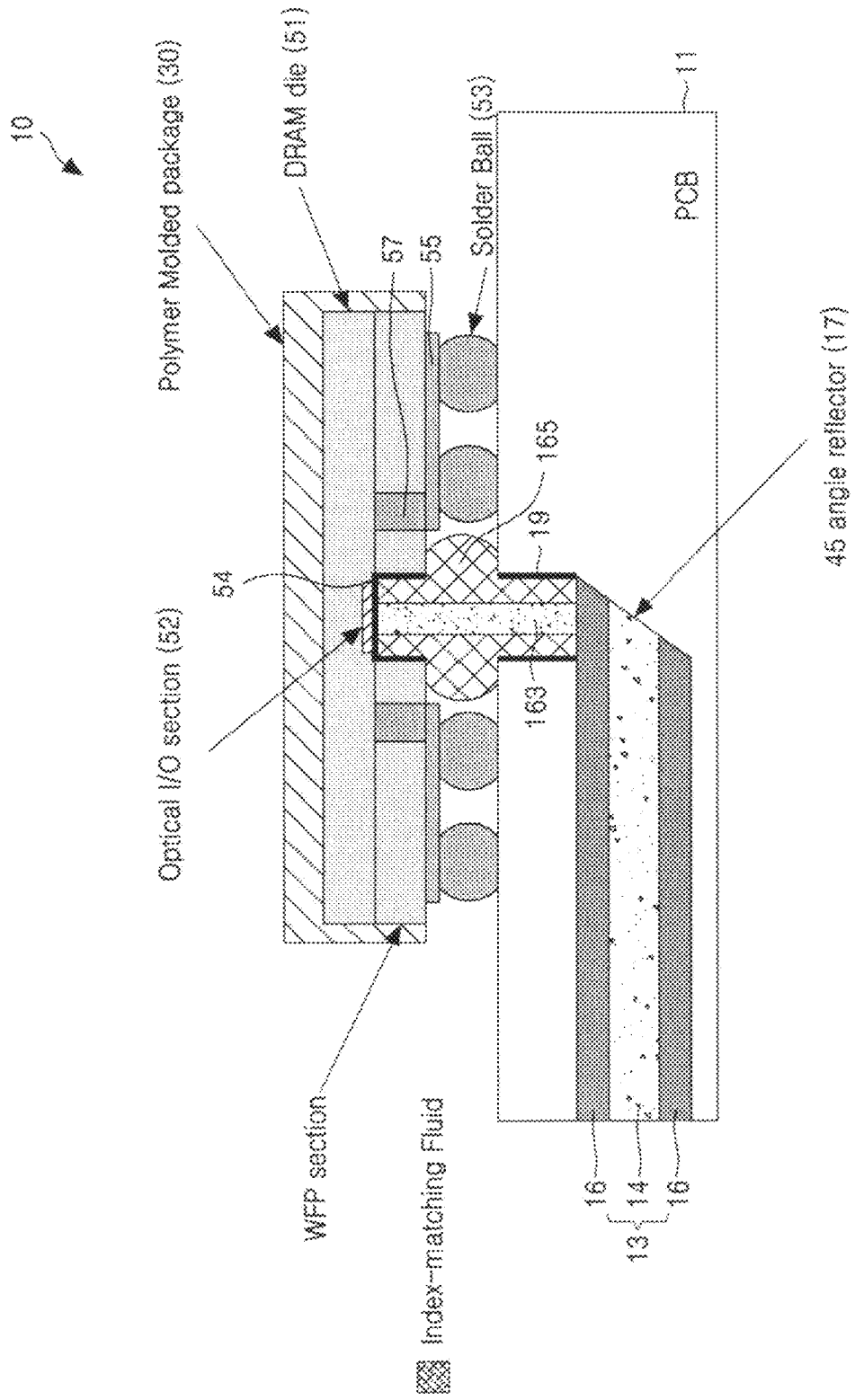
FIG. 10 shows a section of a memory module including a memory package according to example embodiments.

FIG. 10 shows a section of a memory module 10 including a memory package 30 according to example embodiments. The example memory module 10 illustrated in FIG. 10 may include WFP. Referring to FIG. 10, an eleventh region 163 for transferring an optical signal may be formed between the first optical window 19 and the second optical window 54. A space between each optical window 19 and 54 may be filled with the transparent substance 165, e.g., an index matching fluid, a glue, or an epoxy. A refractive index of the eleventh region 163 may be larger than a refractive index of the transparent substance 165. A refractive index of the eleventh region 163 may also be equal or similar to one of the core region 14. To be more specific, the eleventh region 163 may be formed between the cladding region 16 and the optical I/O section 52.

Figure 11:
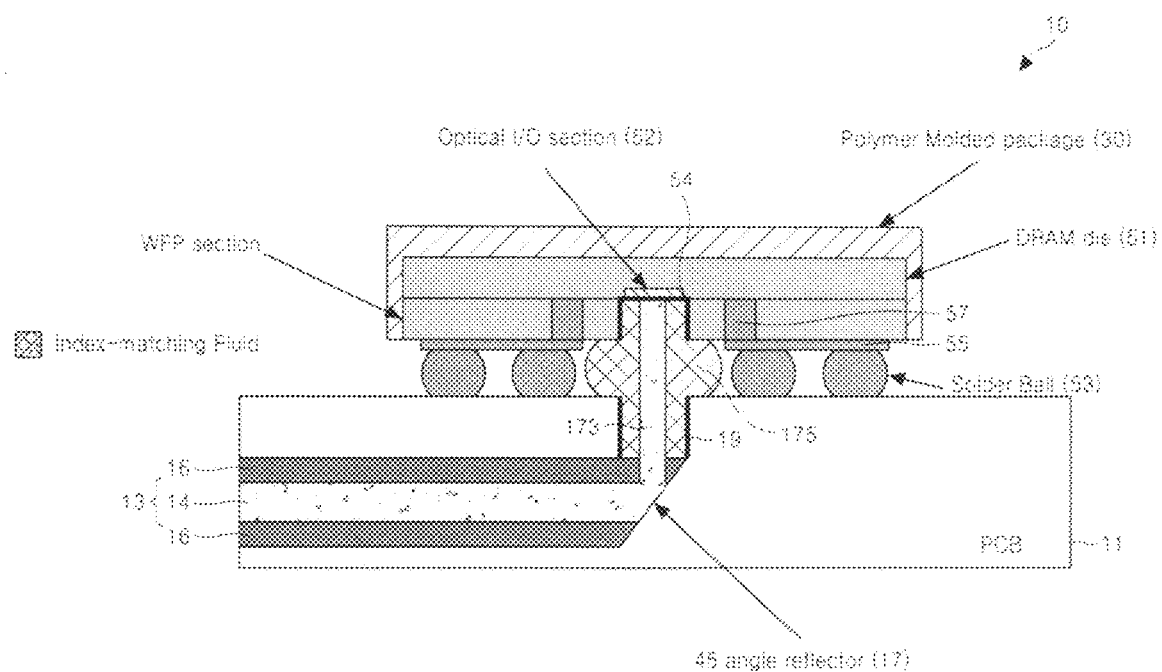
FIG. 11 shows a section of a memory module including a memory package according to example embodiments.

FIG. 11 shows a section of an example memory module 10 including a memory package 30 according to example embodiments. The memory module 10 illustrated in FIG. 10 may include WFP. Referring to FIG. 11, a twelfth region 173 for transferring an optical signal may be directly connected to the core region 14. The transparent substance 175, e.g., an index matching fluid, a glue or an epoxy, may fill a space between the optical windows 19 and 54.

Example embodiments have been explained referring to FIGS. 1 to 11. In example embodiments, a technical concept of sending and/or receiving an optical signal through an optical window formed in a memory package and an optical window formed in the PCB, may be applicable regardless of a kind of package mounted to a memory module. The memory module of example embodiments may send and/or receive an optical signal through an optical window formed in the memory package and an optical window formed on the PCB.

Although example embodiments have been shown and described, it will be appreciated by those skilled in the art that changes may be made in example embodiments without departing from the principles and spirit of the general inventive concept, the scope of which is defined in the appended claims and their equivalents.

What is claimed is:

1. A memory module comprising: a printed circuit board including an embedded optical waveguide, a first optical window on a surface of the printed circuit board, and an optical reflector; and a memory package on the printed circuit board, the memory package including a memory die having an optical input/output section and a second optical window under the optical input/output section, the second optical window being an opening defined in the memory package, wherein the optical input/output section, the second optical window, and the first optical window are arranged in a line and the optical reflector is configured to at least one of reflect an optical signal output from the optical waveguide through the first optical window and the second optical window to the optical input/output section according to order of arrangement and reflect an optical signal output from the optical input/output section through the second optical window and the first optical window to the optical waveguide according to the order of arrangement.

2. The memory module of claim 1, wherein
the optical waveguide includes a first section embedded in the printed circuit board and a second section in the first optical window, wherein
the optical reflector configured to at least one of reflect an optical signal from the first section of the optical waveguide to the second section of the optical waveguide and reflect an optical signal from the second section of the optical waveguide to the first section of the optical waveguide.

3. The memory module of claim 1, further comprising:
one of an optically transparent index matching fluid, an optically transparent glue, and an optically transparent epoxy between the first optical window and the second optical window.

4. The memory module of claim 1, further comprising:
a first filler in the first optical window;
a second filler in the second optical window; and
a third filler between the first filler and the second filler.

5. The memory module of claim 1, wherein the optical input/output section includes
a photo-electric conversion element configured to convert a first optical signal from the optical waveguide to a first electrical signal and to transmit the first electrical signal to a signal processing block; and
an electrical-optical conversion element configured to convert a second electrical signal from the signal processing block to a second optical signal and for transmitting the second optical signal to the optical waveguide via the first and second optical windows.

6. A memory system comprising:
a main board including a signal converter, a central processing unit, and a slot; and
the memory module of claim 1 connected to the slot,
wherein the signal converter is configured to at least one of
convert a first electrical signal from the central processing unit to a first optical signal and to transmit the first optical signal to the waveguide, and
convert a second optical signal from the waveguide to a second electrical signal and to transmit the second electrical signal to the central processing unit.

7. The memory module of claim 1, wherein the second optical window is defined in the memory package and filled with at least one of a transparent and a refractive index matching material.

8. The memory module of claim 2, wherein the optical reflector meets an extension line of the first section at an angle of 45 degrees.

9. The memory module of claim 4, wherein the first filler, the second filler, and the third filler are one of an index matching fluid, a glue, and an epoxy.

10. The memory system of claim 6, further comprising: a light source configured to generate light for one of transmitting and receiving data between the package and the central processing unit.

11. The memory system of claim 6, wherein the memory module further includes one of an optically transparent index matching fluid, an optically transparent glue, and an optically transparent epoxy between the first optical window and the second optical window.

12. The memory system of claim 6, wherein the memory module includes
a first filler in the first optical window;
a second filler in the second optical window; and
a third filler between the first filler and the second filler.

13. The memory system of claim 6, wherein the signal converter is in the central processing unit.

14. The memory system of claim 12, wherein the first filler, the second filler, and the third filler are one of an index matching fluid, a glue, and an epoxy.

15. A method for manufacturing a memory module comprising:
providing a printed circuit board having a built-in optical waveguide, a first optical window on a surface of the printed circuit board; placing a memory package on the printed circuit board, the memory package including a built-in memory die having an optical input/output section and a second optical window under the optical input/output section, the second optical window being an opening defined in the memory package; such that the second optical window, the optical input/output section, and the first optical window are arranged in a line;
filling a space between the first optical window and the second optical window with a filler; and
reflecting, using an optical reflector, at least one of an optical signal output from the optical waveguide through the first optical window and the second optical window to the optical input/output section according to order of arrangement and an optical signal output from the optical input/output section through the second optical window and the first optical window to the optical waveguide according to the order of arrangement.

16. The method of claim 15, further comprising:
forming the optical reflector in the printed circuit board, wherein the optical reflector is configured to reflect at least one of an optical signal transmitted through the optical waveguide to the optical input/output section and an optical signal from the optical input/output section to the optical waveguide.

17. The method of claim 15, wherein the filling with filler comprises:
filling the first optical window with a first filler;
filling the second optical window with a second filler; and
filling a space between the first filler and the second filler with a third filler.

18. The method of claim 17, wherein the first filler, the second filler and the third filler are one of an index matching fluid, a glue, and an epoxy.

* * * * *